United States Patent
Sato

(10) Patent No.: US 6,982,796 B2
(45) Date of Patent: Jan. 3, 2006

(54) WAVEFRONT SPLITTING ELEMENT FOR EUV LIGHT AND PHASE MEASURING APPARATUS USING THE SAME

(75) Inventor: Ryuichi Sato, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 350 days.

(21) Appl. No.: 10/354,657

(22) Filed: Jan. 30, 2003

(65) Prior Publication Data

US 2003/0142322 A1    Jul. 31, 2003

(30) Foreign Application Priority Data

Jan. 31, 2002    (JP) ............................. 2002-024470

(51) Int. Cl.
*G01B 9/02*    (2006.01)

(52) U.S. Cl. ...................................... 356/521; 356/503

(58) Field of Classification Search ................ 356/499, 356/494, 488, 521, 491, 492, 503, 504
See application file for complete search history.

(56) References Cited

U.S. PATENT DOCUMENTS

| | | | | |
|---|---|---|---|---|
| 4,768,183 | A | * | 8/1988 | Ohnishi et al. ......... 369/112.05 |
| 5,574,560 | A | * | 11/1996 | Franz et al. ................. 356/498 |
| 6,498,685 | B1 | * | 12/2002 | Johnson ..................... 359/626 |
| 6,678,037 | B2 | * | 1/2004 | Van Elp et al. ............... 355/67 |
| 6,861,846 | B2 | * | 3/2005 | Anderson ................... 324/623 |
| 2003/0144819 | A1 | * | 7/2003 | Takeuchi et al. ............ 702/189 |

* cited by examiner

Primary Examiner—Hwa (Andrew) Lee
Assistant Examiner—Patrick Connolly
(74) Attorney, Agent, or Firm—Morgan & Finnegan, LLP

(57) ABSTRACT

A wavefront splitting element includes a diffraction grating for splitting light into multiple beams including transmitting light and reflected light.

2 Claims, 2 Drawing Sheets

WAVEFRONT SPLITTING ELEMENT FOR EUV LIGHT AND PHASE MEASURING APPARATUS USING THE SAME

BACKGROUND OF THE INVENTION

The present invention relates to wavefront splitting elements for EUV light and phase measuring apparatuses using the same, and is suitable for measuring a phase of an optical thin film put on a reflection surface and transmission surface of an optical system used for an exposure apparatus of a step and repeat method, a step and scan method, etc. for fabricating devices, e.g., semiconductor devices such as ICs, LSIs, etc., image pick-up devices such as CCDs, etc., and display devices such as liquid crystal panels, etc.

Along with the miniaturization of device patterns, an exposure wavelength for projecting and exposing a device pattern onto a photosensitive material is becoming shorter and shorter. For example, an exposure wavelength is in transition from KrF (with a wavelength of 248 nm) to ArF (with a wavelength of 193 nm) and $F_2$ laser (with a wavelength of 157 nm), and even EUV light with a wavelength of 13.4 nm has also reduced to practice.

A smaller device pattern is the most important factor that supports the dynamics in the semiconductor industry, and thus the age requiring for the resolution with a critical dimension ("CD") of 250 nm for DRAMs is rapidly changing to that of CDs of 180 nm, 130 nm, and even 100 nm. The lithography using i-line (a wavelength of 356 nm) as exposure light has never required the resolution with a CD less than a wavelength.

On the other hand, KrF with a wavelength of 248 nm has been applied for the lithography that requires a CD of 180 nm or even 150 nm. The resolution with a CD less than a wavelength is about to reduce to practice by exploiting achievements in improved resists and the super-resolution techniques, etc. Various super-resolution techniques would possibly realize the pattern resolution with a CD of a ½ wavelength in the line and space.

However, the super-resolution techniques often go with pattern manufacturing restrictions, and the most effective way of improving resolution is, after all, to make shorter a wavelength of exposure light and to make higher the NA of a projection optical system. This fact greatly motivates to seek for shorter wavelengths of exposure light, leading to a development of the EUV lithography that uses light with a wavelength of 10–15 nm as exposure light.

The EUV light as exposure light requires an all-mirror system, and it is difficult to control the characteristics of a reflection enhancement film to be applied for expected reflectance onto the mirror. The materials for the film have also many restrictions, and its fundamental structure is typically made of a film (i.e., a multilayer film) of Mo and Si alternate layer. Other multilayers include, for example, Be—Si and Rh—Si multilayers. Where one pair is a Mo and Si alternate layer, a film requires a multilayer of 40 pairs, and provides extremely drastic changes of optical characteristics.

Characteristically, a film for the EUV region requires control over its phase (or phase distribution) as well as its reflectance. When the EUV light reflects on the film, its phase changes. The phase distribution in the film distorts the wavefront that enters a mirror surface, and an offset in the cycle length of the film in the mirror surface would cause an aberration (i.e., a wavefront aberration). Therefore, it is desirable to measure the film's phase (or phase distribution) as soon as the film is put onto the mirror surface. In particular, it is desirable to measure angular characteristics when light is brought into the film at various angles.

An angle of light incident to an actual mirror is so small that most incident light rests in an angular distribution range from several degrees at a small position to about 20 degrees at a large position. When the phase distribution of a film applied to the mirror surface is measured with various incident angles, the measurement close to an angle close to the perpendicular incidence is difficult because the beams superimpose in the reflection system as a measurement system.

In particular, when an interferometer is used to detect phase information dependent on an incident angle of a film applied to a mirror surface, it has been very difficult to measure the film's phase information at an incident angle of 0° since there are no appropriate materials available for the EUV light region for splitting the incident light and reflected light that go reversely along the same optical path.

Therefore, a conventional measuring system has exclusively used PDIs, shearing interferometers, etc. that have no need of beam splitters for the EUV region.

BRIEF SUMMARY OF THE INVENTION

It is an exemplary object of the present invention to provide a wavefront splitting element for the EUV light that can easily split incident light into transmitting light and reflected light, and is suitably applicable to various measuring systems that use the EUV light.

Another exemplary object of the present invention is to provide a phase measuring apparatus that can easily and accurately measure angular characteristics of a film applied onto curved and plane mirrors, especially phase characteristics of the film at angles including the normal incidence.

Still another exemplary object of the present invention is to provide a measuring apparatus adapted to split light incident onto and reflected from an object to be tested by using the above.

A wavefront splitting element of one aspect of the present invention includes a diffraction grating for splitting light or EUV light into multiple beams including transmitting light and reflected light. The wavefront splitting element may use a diffraction effect obtainable by a repetitive pattern comprised of a transmission part and a reflection part.

A phase measuring apparatus includes an interferometer having a wavefront splitting element that includes a diffraction grating for splitting the EUV light into transmitting light and reflected light constitutes another aspect of the present invention.

A phase measuring apparatus of another aspect of the present invention that measures phase information dependent on an angle incident on a film applied onto an object to be tested based on the interference information includes a beam splitter using a diffraction grating to split a beam from a light source into multiple beams including transmitting light and reflected light, a reflecting mechanism for condensing one beam that has been split by the beam splitter, and introduces the beam to the object as well as introducing detection light reflected from the object into the beam splitter, a reference plate for reflecting another beam that has been split by the beam splitter, and brings it into the beam splitter as reference light, an imaging system for forming, on a predetermined surface, interference light obtained when the detection light and the reference light are superimposed by the beam splitter, and a detector for detecting the interference information on the predetermined surface.

A phase measuring apparatus of still another aspect of the present invention that measures phase information dependent on an angle incident on a film applied onto an object to be tested based on the interference information includes a beam splitter using a diffraction grating to split a beam from a light source into multiple beams including transmitting light and reflected light, a reflecting mechanism for condensing one beam that has been split by the beam splitter, and introduces the beam to the object as well as introducing detection light reflected from the object into the beam splitter, and a detector, including another diffraction grating, for detecting the interference information from the detection light via the beam splitter.

An exposure apparatus includes an optical element measured by using the above phase measuring apparatus constitutes another aspect of the present invention.

A device fabrication method of another aspect of the present invention includes the steps of exposing onto a target by using the above exposure apparatus, and developing the exposed target.

DETAILED DESCRIPTION OF THE PREFERRED EMBODIMENTS

Figure 1:
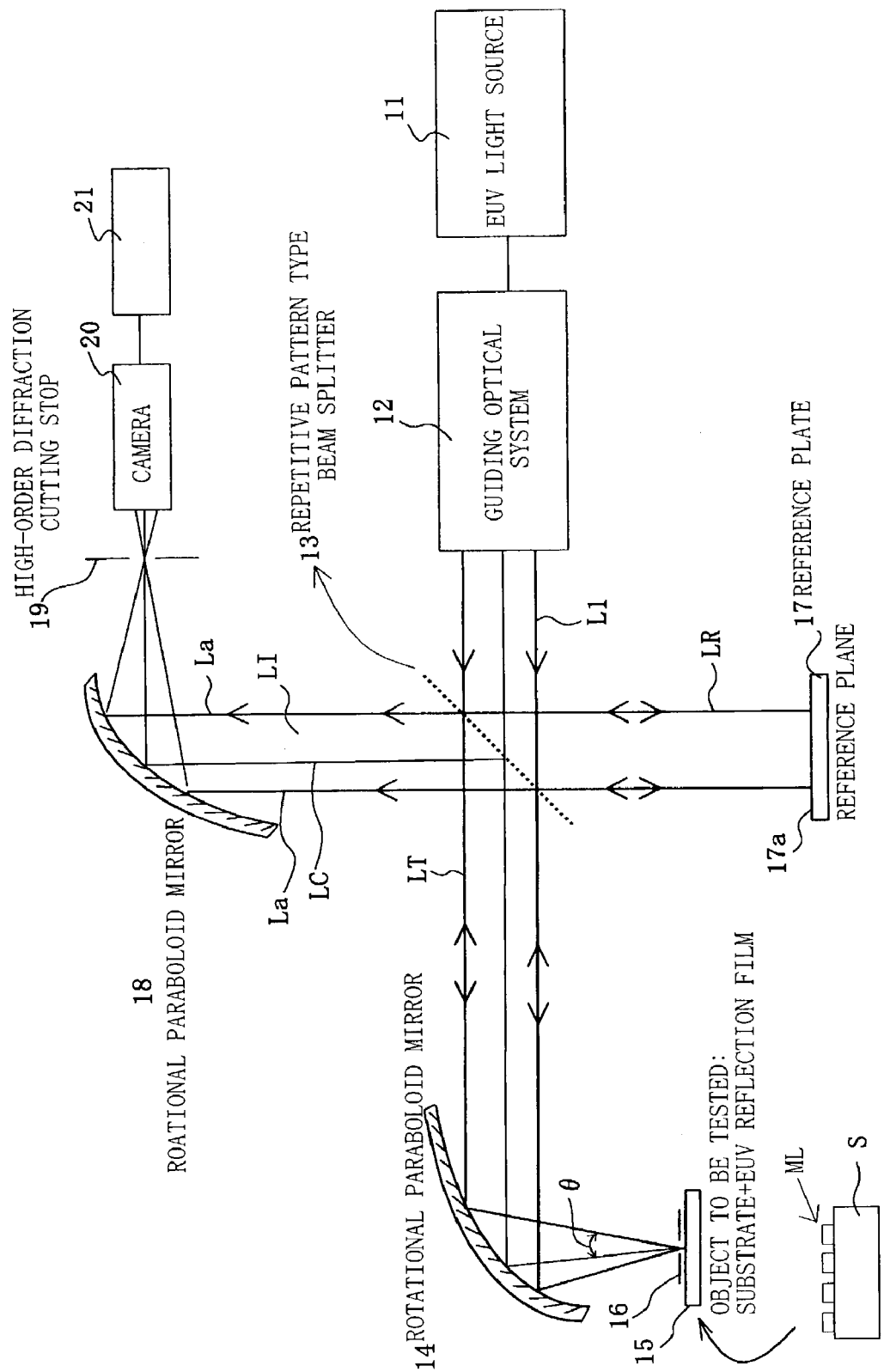
FIG. 1 is a schematic view showing principal parts for a first embodiment of the present invention.

FIG. 1 is a schematic view showing principal parts of a phase measuring apparatus that includes a wavefront splitting element for EUV light, of a first embodiment of this invention. This embodiment discusses a measurement of phase characteristics dependent on incident light angles, including a perpendicular incidence, onto a multilayer film (which may be a monolayer film and simply called a "film" hereinafter) ML applied onto a substrate S.

A substrate S onto which a film is applied in this embodiment may be a free standing film made, for example, of Be or alternate layers of Mo and Si, while the light shielding part is made of Ni, Ti or Ag.

In FIG. 1, 11 is an EUV light source, radiating light to be used for measurement. For light to be used for measurement, EUV light sources may use an SOR, undulator and SOR, LPP, Discharge Lamp, etc., and emits light with a wavelength of 10–15 nm (EUV light). Light from the EUV light source is emitted as parallel light via a guiding optical system 12 as an optical means that includes a condensing optical system. As an optical system for the guiding optical system 12 may include, for example, a paraboloid mirror, an elliptic mirror, an aspheric mirror, etc. to emit parallel light.

13 is a beam splitter as a wave splitting element for the EUV light, and light from the guiding optical system is split into transmitting light LT and reflected light LR. The beam splitter 13 uses a grating (or a diffraction grating) with a repetitive pattern that includes a transmission part and a reflection part to split incident light into multiple beams including transmitting light and reflected light.

The EUV region has a restriction of a usable optical element due to restricted materials applicable to EUV optical systems. Especially, refractive elements like lenses cannot be used. Accordingly, the instant embodiment uses a grating as a beam splitter to split light.

14 is a reflecting means including a rotational paraboloid mirror, which condenses light LT passing through the beam splitter 13 as light having a range with incident angles of 0°-θ° including the perpendicular incidence, thus introducing it onto the object 15 to be tested.

16 is a stop, which shields high-order diffracted light produced by the beam splitter 13 so as to extract only a beam reflected by 0-order diffracted light.

The object 15 is provided with such a film for the EUV light to reflect on the substrate S with a flat surface or a curved surface or an aspheric surface or the like, as one of, e.g., Mo—Bi, Be—Si, Rh—Si, etc.

Light incident upon the film ML on the object 15 is reflected with a different phase skip according to an incident angle. The reflected light would not include the distorted wavefront of incident light with the constant amount of the film ML's phase skip (a phase distribution), but would include advancing or delayed phase according to its incident angle with a phase distribution. Thus, it will become light (or detection light) that has a phase distribution different from the incident wavefront, thus returning to the rotational paraboloid mirror 14, which in turn reflects it and enables it to enter the grating 13.

Among the beams from the guiding optical system 12, the one RL reflected on the grating 13 is reflected on a reference plane 17a of a reference plate 17 that applies a film for reflecting the EUV light on its surface, returns along the original light path as a beam of reference, and enters the grating 13.

The detection light from the rotational paraboloid mirror 14 is reflected on the grating 13. The reference light from the reference plane 17a passes through the grating 13. These two beams superimpose each other via the grating 13, and form interference light LI and thus an interference signal. The interference signal of this time includes phase characteristics of the film dependent on an angle incident on the object 15. Namely, the light along the central axis LC in the interference information exhibits a phase characteristic of the film of the incident angle 0°, and the interference information on the end position La away from the central axis LC exhibits a phase characteristic of the film at the incident angle θ°.

A repetitive pitch in a diffraction pattern on the beam splitter 13 is set such that the rotational paraboloid mirror 14 and the neighborhood of the reference plane are in the Fraunhofer diffraction area.

Here, the Fraunhofer area means one that satisfies the following condition of $D >> \pi (d/2)^2 / \lambda$ where $\lambda$ is a wavelength of light for measurement, d is a pitch of the grating 13, and D is a distance from the grating 13 to the rotational paraboloid mirror 14 or the reference plate 17.

More specifically, for example, where $\lambda = 13.5 \times 10^{-6}$ mm, $d = 0.02$ mm, the result is $D >> 23$ mm and D is equal to or larger than 100 mm.

The rotational paraboloid mirror 18 as an imaging means condenses the interference light LI from the grating 13, and a stop 19 provided at the shielding point shields high-order diffracted light. Signal light including interference information is detected by the detector 20.

The instant embodiment uses the beam splitter 13 to superimpose the detection light and reference light for interference between these two beams. An interference pattern is formed on the stop 19 via the rotational paraboloid mirror 18. The detector behind the stop 19 obtains the interference pattern. Arithmetic means to analyze the interference information measures the phase distribution of the wavefront reflected on the film ML of the object, and thereby identifying phase characteristics of the film dependent on the angle of light incident on the film ML.

This embodiment introduces reflected light among the beams split by the beam splitter 13 into the object while bringing transmitting light into the reference plate 17.

Figure 2:
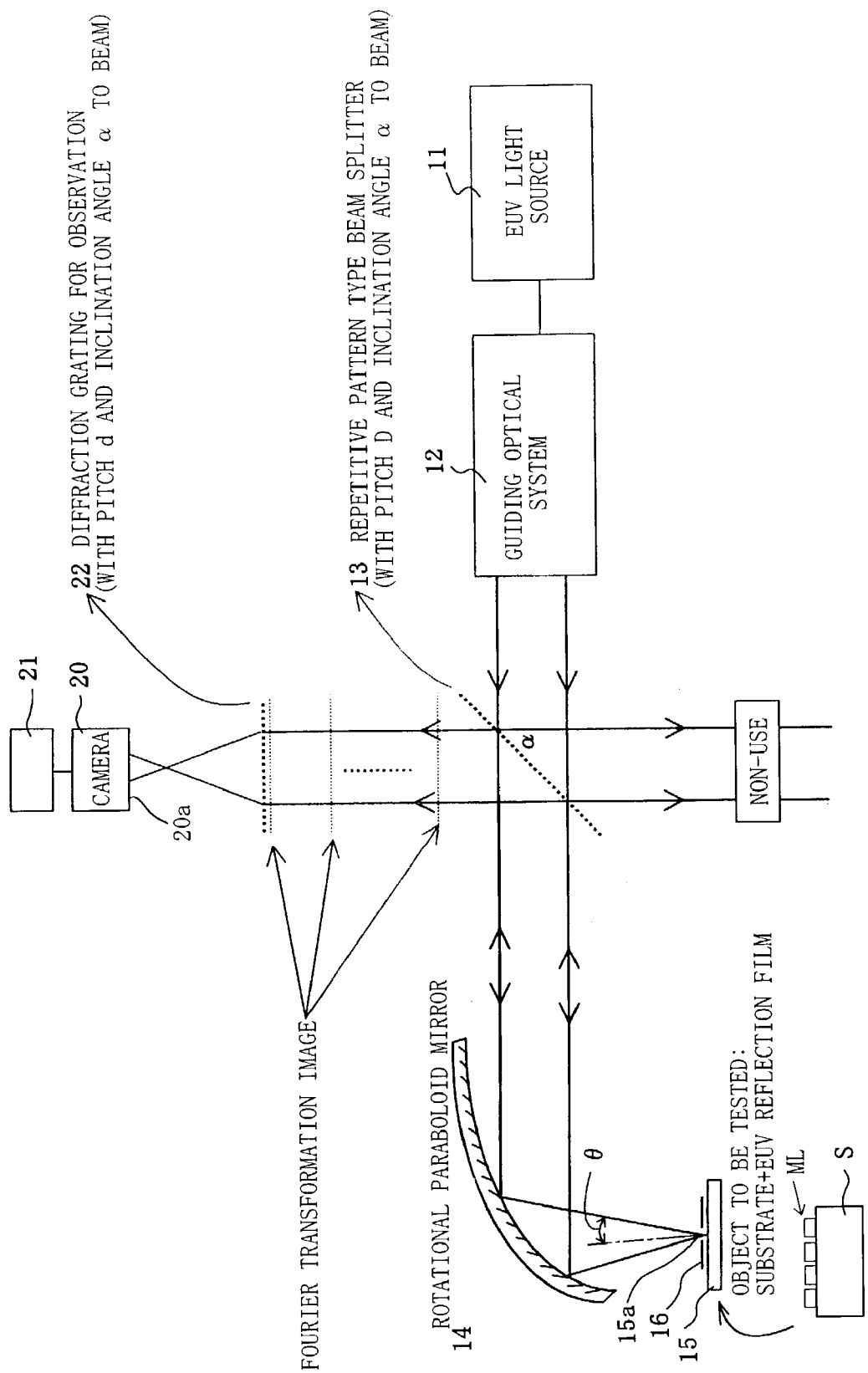
FIG. 2 is a schematic view showing principal parts for a second embodiment of the present invention.

FIG. 2 is a schematic view showing principal parts in the phase measuring apparatus of a second embodiment according to the present invention. The second embodiment is different from the first embodiment in that shearing interference (or talbo interference) is used to measure a phase distribution of a wavefront of reflected light reflected on the film ML. The same numerals in FIG. 2 are used for the same members as those used in FIG. 1.

The second embodiment enables light that has been reflected at the measuring point 15a on the film ML of the object, and then reflected on the rotational paraboloid mirror 14, to be reflected on the (diffraction) grating 13, thus forming a Fourier transformation image. The grating 13 is arranged with an inclined angle α=45° to a beam.

This embodiment forms plural Fourier transformation images at an interval of $(d \cdot \sin \alpha)^2/\lambda$, where d is the pitch of the diffraction grating 13, and α is an inclined angle relative to a beam. The interval of Fourier transformation images is 14.8 mm where $\lambda = 13.5 \times 10^{-6}$ mm, d=0.02 mm, α=45°.

Similar to the first embodiment, the repetitive pitch d in the diffracted grating on the beam splitter 13 is set up such that the neighborhood of the rotational paraboloid mirror 14 is a Fraunhofer diffraction region. A diffraction grating 22 is arranged for observation near a location where the Fourier transformation image is formed. The grating pitch for the diffraction grating for observation is (d·sin α).

Interference pattern information obtained via this observation diffraction grating 22 is a laterally shifted shearing interference pattern. This interference signal is formed as interference information (or an interference pattern) on the detection surface 20a of the detector 20 such as CCDs and the like. This is what is known as a Talbo interferometer.

Here, interference information formed at various places on the detection surface 20a is that corresponding to angles of incidence onto the film. For example, the center is an incident angle 0°, and the end part is an incident angle θ°. The detector 20 detects interference information formed on the detecting surface 20a, and detects phase information of the film dependent on the angle of light incident on the film ML of the object 15.

This embodiment introduces light that has been reflected on the beam splitter 13 into the object without using transmitting light.

The above embodiments may use light in an ultraviolet region and visible range as measurement light in addition to the EUV light.

An optical element measured by using the above phase measuring apparatus may be incorporated into an exposure apparatus or any other optical apparatuses.

A device may be fabricated by going through the steps of exposing a target object (a wafer and the like) and developing the exposed object by using an exposure apparatus employing the above described phase measuring method or phase measuring apparatus. This device fabrication method includes other various publicly known steps as well as the above ones.

According to the present invention, it is possible to easily split incident light into transmitting light and reflected light, and achieve a wavefront splitting element for the EUV light suitably applicable to various measuring apparatuses using the EUV light, and a phase measuring apparatus using the same.

According to the present invention, it is also possible to achieve a phase measuring apparatus that can easily and accurately measure angular characteristics of a film applied to a reflecting mirror with a curvature and a plane reflecting mirror, especially phase characteristics of a film of angles including the normal incidence.

What is claimed is:

1. A phase measuring apparatus that measures phase information dependent on an angle incident on a film applied onto an object to be tested based on the interference information, said phase measuring apparatus comprising:
   a beam splitter using a diffraction grating to split a beam from a light source into multiple beams including transmitting light and reflected light;
   a reflecting mechanism for condensing one beam that has been split by said beam splitter, and introduces the beam to the object as well as introducing detection light reflected from the object into said beam splitter;
   a reference plate for reflecting another beam that has been split by said beam splitter, and brings it into said beam splitter as reference light;
   an imaging system for forming, on a predetermined surface, interference light obtained when the detection light and the reference light are superimposed by said beam splitter; and
   a detector for detecting the interference information on the predetermined surface.

2. A phase measuring apparatus that measures phase information dependent on an angle incident on a film applied onto an object to be tested based on the interference information, said phase measuring apparatus comprising:
   a beam splitter using a diffraction grating to split a beam from a light source into multiple beams including transmitting light and reflected light;
   a reflecting mechanism for condensing one beam that has been split by said beam splitter, and introduces the beam to the object as well as introducing detection light reflected from the object into said beam splitter; and
   a detector, including another diffraction grating, for detecting the interference information from the detection light via said beam splitter.

* * * * *